United States Patent
Yang

(10) Patent No.: US 12,142,312 B2
(45) Date of Patent: Nov. 12, 2024

(54) MEMORY CONTROL CIRCUIT AND REFRESH METHOD FOR DYNAMIC RANDOM ACCESS MEMORY ARRAY

(71) Applicant: NANYA TECHNOLOGY CORPORATION, New Taipei (TW)

(72) Inventor: Shu-Wei Yang, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 178 days.

(21) Appl. No.: 17/944,162

(22) Filed: Sep. 13, 2022

(65) Prior Publication Data

US 2024/0087635 A1 Mar. 14, 2024

(51) Int. Cl.
*G11C 16/04* (2006.01)
*G11C 11/406* (2006.01)
*G11C 11/408* (2006.01)

(52) U.S. Cl.
CPC ... *G11C 11/40611* (2013.01); *G11C 11/40622* (2013.01); *G11C 11/408* (2013.01)

(58) Field of Classification Search
CPC ......... G11C 11/40611; G11C 11/40622; G11C 11/408
See application file for complete search history.

(56) References Cited

U.S. PATENT DOCUMENTS

| 9,728,244 | B2 | 8/2017 | Kim |
| 9,875,785 | B2 | 1/2018 | Jose et al. |
| 10,692,561 | B2 | 6/2020 | Jang et al. |
| 10,867,660 | B2 | 12/2020 | Akamatsu |
| 11,664,065 | B2* | 5/2023 | Yen .................. G11C 11/40611 365/222 |
| 11,784,122 | B2* | 10/2023 | Lee ..................... H01L 23/5228 257/368 |
| 2004/0093461 | A1 | 5/2004 | Kim |
| 2023/0206989 | A1* | 6/2023 | He ...................... G11C 11/4087 365/189.02 |

OTHER PUBLICATIONS

"Office Action of Taiwan Counterpart Application", issued on Mar. 15, 2024, p. 1-p. 6.

* cited by examiner

*Primary Examiner* — Pho M Luu
(74) *Attorney, Agent, or Firm* — JCIPRNET

(57) ABSTRACT

A memory control circuit and a refresh method for a dynamic random access memory (DRAM) array are provided. The memory control circuit includes a mode register circuit, a command decoder and a refresh circuit. The mode register circuit includes a plurality of mode registers. The command decoder receives a refresh command and sets a flag of a target mode register corresponding to the refresh command among the plurality of mode registers to a setting value. The refresh circuit refreshes the DRAM array in response to the refresh command through the command decoder and the setting value of the flag of the target mode register.

9 Claims, 5 Drawing Sheets

MEMORY CONTROL CIRCUIT AND REFRESH METHOD FOR DYNAMIC RANDOM ACCESS MEMORY ARRAY

BACKGROUND

Technical Field

The disclosure generally relates to a memory control circuit and a refresh method, and more particularly to a memory control circuit and a refresh method for a dynamic random access memory (DRAM) array.

Description of Related Art

By a standard of Joint Electron Device Engineering Council (JEDEC), at least one refresh operation a dynamic random access memory (DRAM) device is only allowed in a designated mode. This implies that when the DRAM device operates a refresh operation without setting a mode register corresponding to the refresh operation, the DRAM device operates abnormally. Besides, the DRAM device has 254 mode registers usually. A user definitely does not familiar with every mode register. The user may miss setting the mode register corresponding to the refresh operation.

SUMMARY

The disclosure provides a memory control circuit and a refresh method for a dynamic random access memory (DRAM) array, capable of setting a target mode register corresponding to a refresh command automatically.

The disclosure provides a memory control circuit for a DRAM array. The memory control circuit includes a mode register circuit, a command decoder and a refresh circuit. The mode register circuit includes a plurality of mode registers. The command decoder is coupled to the mode register circuit. The command decoder receives a refresh command and sets a flag of a target mode register corresponding to the refresh command among the plurality of mode registers to a setting value. The refresh circuit is coupled to the mode register circuit and the command decoder. The refresh circuit refreshes the DRAM array in response to the refresh command through the command decoder and the setting value of the flag of the target mode register.

The disclosure provides a refresh method for a DRAM array. The refresh method includes: receiving, by a command decoder, a refresh command; setting, by the command decoder, a flag of a target mode register corresponding to the refresh command among a plurality of mode registers of a mode register circuit to a setting value; and refresh, by a refresh circuit, the DRAM array in response to the refresh command through the command decoder and the setting value of the flag of the target mode register.

Based on the above description, the command decoder receives the refresh command and sets the flag of the target mode register corresponding to the received refresh command to the setting value. Therefore, the flag of the target mode register is set automatically in response to the received refresh command. A risk of abnormal refresh operations could be reduced.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

A disclosure may be understood by reference to the following detailed description, taken in conjunction with the drawings as described below. It is noted that, for purposes of illustrative clarity and being easily understood by the readers, various drawings of this disclosure show a portion of an electronic device, and certain elements in various drawings may not be drawn to scale. In addition, the number and dimension of each device shown in drawings are only illustrative and are not intended to limit the scope of a disclosure.

Certain terms are used throughout the description and following claims to refer to particular components. As one skilled in the art will understand, electronic equipment manufacturers may refer to a component by different names. This document does not intend to distinguish between components that differ in name but not function. In the following description and in the claims, the terms "include", "comprise" and "have" are used in an open-ended fashion, and thus should be interpreted to mean "include, but not limited to . . . ". Thus, when the terms "include", "comprise" and/or "have" are used in the description of a disclosure, the corresponding features, areas, steps, operations and/or components would be pointed to existence, but not limited to the existence of one or a plurality of the corresponding features, areas, steps, operations and/or components.

It will be understood that when an element is referred to as being "coupled to", "connected to", or "conducted to" another element, it may be directly connected to the other element and established directly electrical connection, or intervening elements may be presented therebetween for relaying electrical connection (indirectly electrical connection). In contrast, when an element is referred to as being "directly coupled to", "directly conducted to", or "directly connected to" another element, there are no intervening elements presented.

Although terms such as first, second, third, etc., may be used to describe diverse constituent elements, such constituent elements are not limited by the terms. The terms are used only to discriminate a constituent element from other constituent elements in the specification. The claims may not use the same terms, but instead may use the terms first, second, third, etc. with respect to the order in which an element is claimed. Accordingly, in the following description, a first constituent element may be a second constituent element in a claim.

Figure 1:
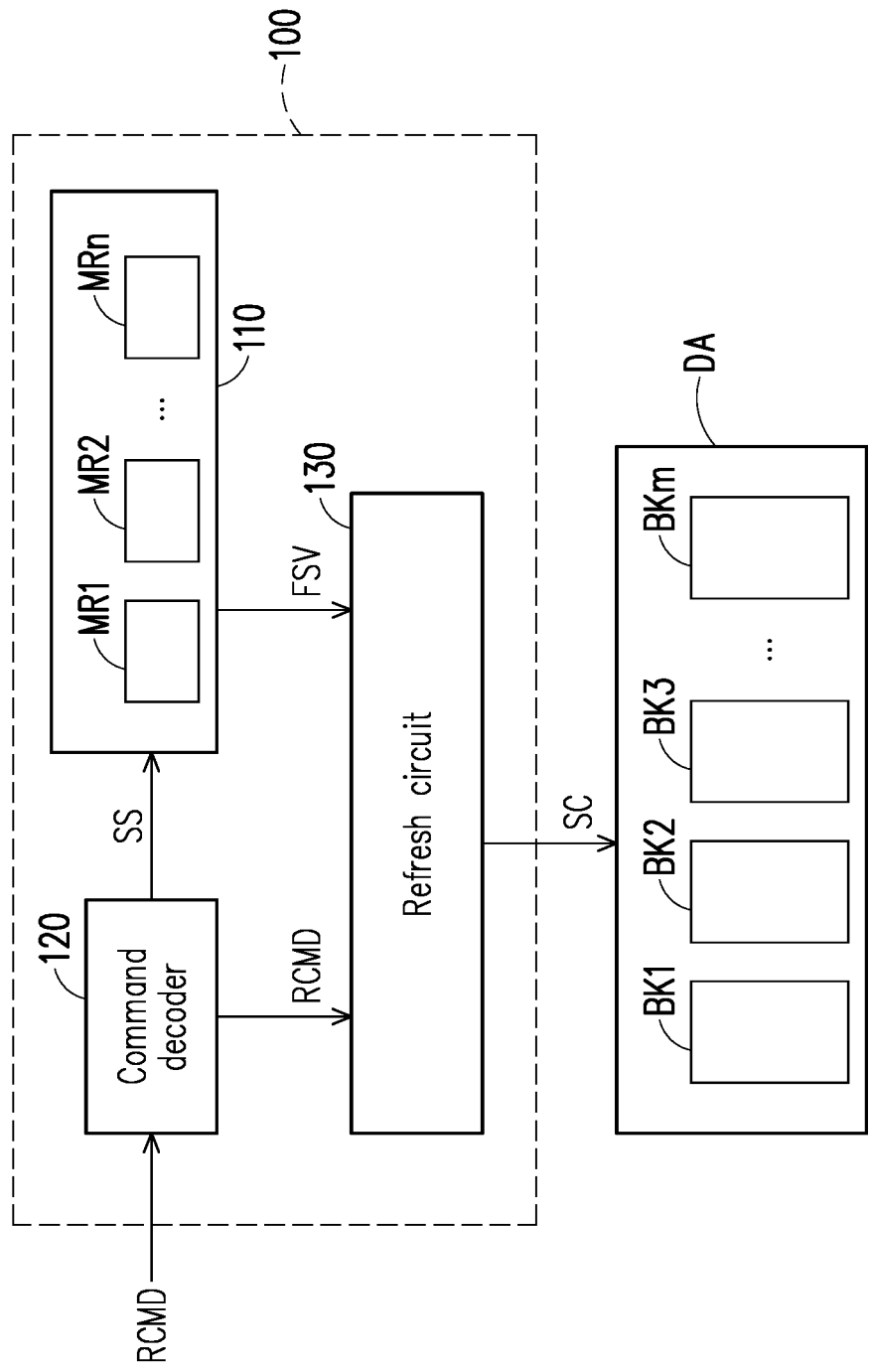
FIG. 1 illustrates a schematic diagram of a memory control circuit and a DRAM array according to an embodiment.

FIG. 1 illustrates a schematic diagram of a memory control circuit and a DRAM array according to an embodiment. Referring to FIG. 1, the memory control circuit 100 is configured to control the DRAM array DA. In the embodiment, the memory control circuit 100 includes a mode register circuit 110, a command decoder 120 and a refresh circuit 130. The mode register 110 circuit includes mode registers MR1 to MRn. In the embodiment, each of the mode registers MR1 to MRn includes a flag. A flag value of the flag is used to indicate an operating mode (for example, one of refresh modes). The command decoder 120 is coupled to the mode register circuit 110. The command decoder 120 receives a refresh command RCMD and sets a flag of a target mode register corresponding to the refresh command RCMD among the mode registers MR1 to MRn to a setting value FSV. For example, when the refresh command RCMD is a first refresh command of a first refresh mode, the command decoder 120 sets a flag of the mode register MR1 corresponding to the first refresh command to the setting value FSV. When the refresh command RCMD is a second refresh command of a first refresh mode, the command decoder 120 sets a flag of the mode register MR2 corresponding to the second refresh command to the setting value FSV, and so on. For example, when the refresh command RCMD is a same-bank refresh (REFsb) command, the command decoder 120 sets the flag of the target mode register corresponding to the same-bank refresh command to the setting value FSV, so that the memory control circuit 100 operates in a fine granular refresh (FGR) mode. For example, the setting value FSV is "1", but the disclosure is not limited thereto.

In the embodiment, the refresh circuit 130 is coupled to the mode register circuit 110 and the command decoder 120. The refresh circuit 130 refreshes the DRAM array DA in response to the refresh command RCMD through the command decoder 120 and the setting value FSV of the flag of the target mode register.

It should be noted, the command decoder 120 receives the refresh command and sets the flag of the target mode register corresponding to the received refresh command RCMD to the setting value FSV. The flag of the target mode register is set automatically in response to the received refresh command RCMD. The user does not need to setting the mode register corresponding to the refresh operation manually. A wrong setting operation of the mode registers from the user could be avoided. Therefore, a risk of abnormal refresh operations could be reduced.

In the embodiment, the command decoder 120 decodes the refresh command RCMD to generate a setting signal SS according to the refresh command RCMD. The flag of the target mode register corresponding to the received refresh command RCMD is set to the setting value FSV by the setting signal SS. Besides, the command decoder 120 transmits the refresh command RCMD to the refresh circuit 130.

In the embodiment, the DRAM array DA includes memory banks BK1~BKm. The refresh circuit 130 may refresh at least one of the memory banks BK1~BKm base on the refresh operation. The refresh operation may be a same-bank refresh operation, an all-bank refresh operation or a per-bank refresh operation, etc.

In the embodiment, the refresh circuit 130 generates a refresh control signal SC in response to the refresh command RCMD through the command decoder 120 and the setting value FSV of the flag of the target mode register. The refresh circuit 130 refreshes refresh at least one of the memory banks BK1~BKm of the DRAM array DA by the refresh control signal SC.

Figure 2:
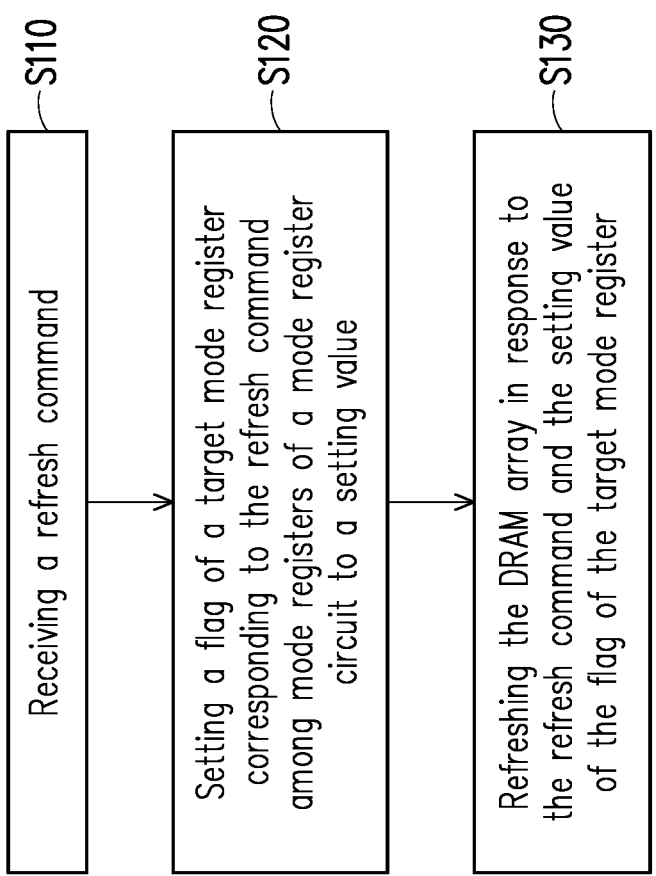
FIG. 2 illustrates a flow chart of a refresh method according to an embodiment of the disclosure.

FIG. 2 illustrates a flow chart of a refresh method according to an embodiment of the disclosure Referring to FIG. 1 and FIG. 2, the refresh method could be applied to refresh the dynamic random access memory array DA. The refresh method could be applied to control the memory control circuit 100. At step S110, the command decoder 120 receives a refresh command. At step S120, the command decoder 120 sets the flag of the target mode register corresponding to the refresh command RCMD among the mode registers MR1 to MRn to the setting value FSV. At step S130, the refresh circuit 130 refreshes the DRAM array DA in response to the refresh command RCMD through the command decoder 120 and the setting value FSV of the flag of the target mode register. Operation details of the step S110 to S130 could be disclosed by the embodiment in FIG. 1, which is not repeated hereinafter.

Figure 3:
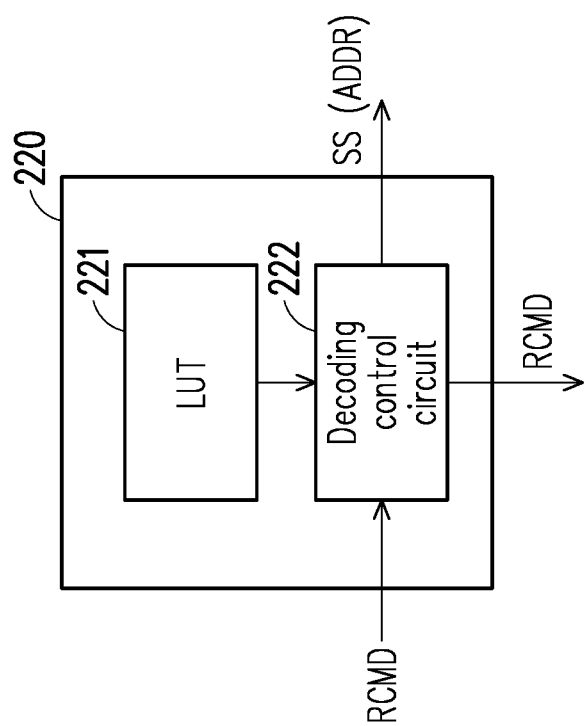
FIG. 3 illustrates a schematic diagram of a command decoder according to an embodiment of the disclosure.

FIG. 3 illustrates a schematic diagram of a command decoder according to an embodiment of the disclosure. Referring to FIG. 1 and FIG. 3, in the embodiment, the command decoder 220 includes a look-up table (LUT) 221. The LUT 221 records a relationship between address of the mode registers MR1 to MRn and the refresh command RCMD. The command decoder 220 identifies the refresh command RCMD to obtain a refresh mode and generates an address data ADDR of the setting signal SS. The address data ADDR corresponds to the target mode register. In the embodiment, the command decoder 220 further includes a decoding control circuit 222. The decoding control circuit 222 receives the refresh command RCMD and obtains the address data ADDR according to the refresh command RCMD by the LUT 221. The decoding control circuit 222 merges the address data ADDR into the setting signal SS. The setting signal SS may determine a mode register corresponding the refresh command RCMD as the target mode register according to the address data ADDR. Therefore, the setting signal SS having the address data ADDR is used to set the flag of the target mode register according to the address data ADDR.

Besides, the decoding control circuit 222 transmits the refresh command RCMD to the refresh circuit 130.

In the embodiment, the LUT 221 may be stored in a memory circuit in the command decoder 220. The memory circuit may be any type of fixed or removable random access memory (RAM) element, read-only memory (ROM) element, flash memory element or similar components or a combination of the above elements. In some embodiments, the LUT 221 may be stored in a memory circuit outside the command decoder 220.

Figure 4:
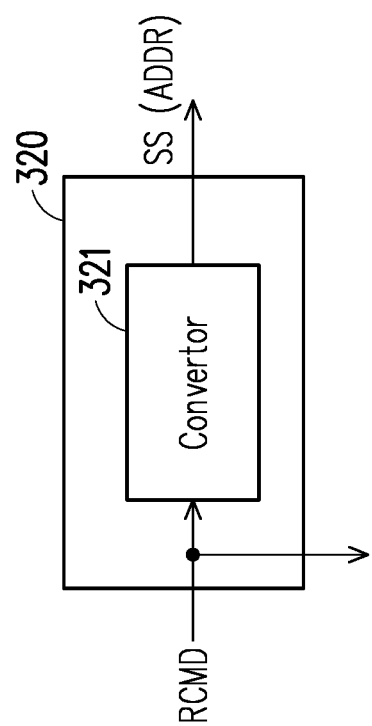
FIG. 4 illustrates a schematic diagram of a command decoder according to another embodiment of the disclosure.

FIG. 4 illustrates a schematic diagram of a command decoder according to another embodiment of the disclosure. Referring to FIG. 1 and FIG. 4, in the embodiment, the command decoder 320 includes a convertor 321. The convertor 321 converts the refresh command RCMD to the setting signal SS having the address data ADDR corresponding to the target mode register.

Figure 5:
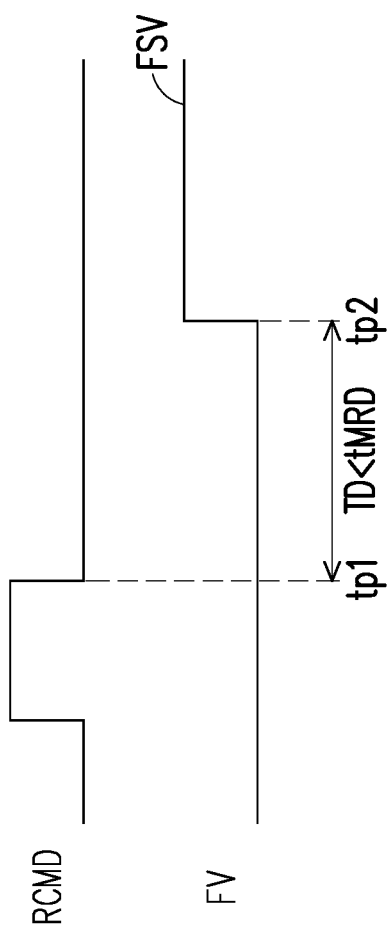
FIG. 5 illustrates a timing diagram of a refresh command and a timing diagram of a flag value according to an embodiment of the disclosure.

FIG. 5 illustrates a timing diagram of a refresh command and a timing diagram of a flag value according to an embodiment of the disclosure. Referring to FIG. 1 and FIG. 5, in the embodiment, FIG. 5 illustrates timing diagram of the refresh command RCMD and a timing diagram of a flag value FV of the target mode register. At a time point tp1, the command decoder 120 finishes receiving the refresh command RCMD. At a time point tp2, the command decoder 120 sets the flag value FV of the target mode register to the setting value FSV. In the embodiment, there is a time length TD between the time point tp1 and the time point tp2. The time length TD is indicated to a time length required to set the flag to the setting value FSV by the command decoder 120.

Generally, after receiving the refresh command RCMD, in order to ensure that the refresh operation is normal, the flag value FV of the target mode register must be specified to be set to the setting value FSV at a cycle time of a mode register command delay tMRD. However, this above timing specification may be missed by the user. The abnormal refresh operations could be occurred by missing this above timing specification by the user.

In the embodiment, the time length TD required to set the flag of the target mode register to the setting value FSV is shorter than the cycle time of a mode register command delay tMRD. Therefore, the command decoder 120 ensures that all of refresh operations comply the above timing specification. In other words, the command decoder 120 can effectively avoid abnormal refresh operations caused by missing operation by the user.

In the embodiment, the command decoder 120 finishes receiving the refresh command RCMD at the time point tp1, and then generates the setting signal SS according to the refresh command RCMD before the time point tp2. Therefore, the command decoder 120 ensures that all of refresh operations comply the timing specification automatically.

In view of the foregoing, the command decoder receives the refresh command and sets the flag of the target mode register corresponding to the received refresh command to the setting value. Therefore, the flag of the target mode register is set automatically in response to the received refresh command. A risk of abnormal refresh operations could be reduced. Besides, in the embodiment, the command decoder ensures that the time length required to set the flag of the target mode register to the setting value is shorter than the cycle time of a mode register command delay. Therefore, the command decoder ensures that all of refresh operations comply the timing specification automatically. The command decoder can effectively avoid abnormal refresh operations caused by missing operation by the user. The disclosure provides an easy-to-use memory control circuit and refresh method for users.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A memory control circuit for a dynamic random access memory (DRAM) array, comprising:
   a mode register circuit, comprising a plurality of mode registers;
   a command decoder, coupled to the mode register circuit, configured to receive a refresh command and set a flag of a target mode register corresponding to the refresh command among the plurality of mode registers to a setting value; and
   a refresh circuit, coupled to the mode register circuit and the command decoder, configured to refresh the DRAM array in response to the refresh command through the command decoder and the setting value of the flag of the target mode register,
   wherein the command decoder decodes the refresh command to generate a setting signal according to the refresh command and transmits the refresh command to the refresh circuit, and
   wherein the command decoder comprising:
      a look-up table, configured to record a relationship between address of the plurality of mode registers and the refresh command.

2. The memory control circuit of claim 1, wherein the command decoder comprising:
   a convertor, configured to convert the refresh command to the setting signal having an address data corresponding to the target mode register.

3. The memory control circuit of claim 1, wherein the command decoder identifies the refresh command to obtain a refresh mode and generates an address data of the setting signal, wherein the address data corresponds to the target mode register.

4. The memory control circuit of claim 1, wherein a time length required to set the flag to the setting value by the command decoder is shorter than a cycle time of a mode register command delay.

5. The memory control circuit of claim 1, wherein when the refresh command is a same bank refresh command, the command decoder set the flag of the target mode register corresponding to the same bank refresh command to the setting value, so that the memory control circuit operates in a fine granular refresh (FGR) mode.

6. A refresh method for a dynamic random access memory (DRAM) array, comprising:
   receiving, by a command decoder, a refresh command;
   setting, by the command decoder, a flag of a target mode register corresponding to the refresh command among a plurality of mode registers of a mode register circuit to a setting value;
   generating, by the command decoder, a setting signal according to the refresh command;
   transmitting, by the command decoder, the refresh command to a refresh circuit; and
   refresh, by the refresh circuit, the DRAM array in response to the refresh command through the command decoder and the setting value of the flag of the target mode register,
   wherein generating the setting signal according to the refresh command comprises:
      converting the refresh command to the setting signal having an address data corresponding to the target mode register.

7. The refresh method of claim 6, wherein generating the setting signal according to the refresh command comprises:
   identifying, by the command decoder, the refresh command to obtain a refresh mode and generates an address data of the setting signal, wherein the address data corresponds to the target mode register.

8. The refresh method of claim 6, wherein a time length required to set the flag to the setting value is shorter than a cycle time of a mode register command delay.

9. The refresh method of claim 6, wherein setting the flag of the target mode register to the setting value comprises:
   when the refresh command is a same bank refresh command, setting the flag of the target mode register corresponding to the same bank refresh command to the setting value, so that the memory control circuit operates in a fine granular refresh (FGR) mode.

* * * * *